United States Patent [19]

Holst

[11] Patent Number: 5,446,685
[45] Date of Patent: Aug. 29, 1995

[54] PULSED GROUND CIRCUIT FOR CAM AND PAL MEMORIES

[75] Inventor: John C. Holst, San Jose, Calif.

[73] Assignee: Intergraph Corporation, Huntsville, Ala.

[21] Appl. No.: 23,904

[22] Filed: Feb. 23, 1993

[51] Int. Cl.[6] .............................................. G11C 15/04
[52] U.S. Cl. ........................................ 365/49; 365/154; 365/230.03; 365/233
[58] Field of Search .................... 365/49, 154, 230.03, 365/233

[56] References Cited

U.S. PATENT DOCUMENTS 4,723,224  2/1988  Van Hullet et al. .................. 365/49
5,257,220 10/1993  Shin et al. ............................. 365/49

FOREIGN PATENT DOCUMENTS 62-293595 12/1987  Japan ..................................... 365/49

Primary Examiner—Joseph A. Popek
Assistant Examiner—Vu A. Le
Attorney, Agent, or Firm—Townsend and Townsend Khourie and Crew; Philip H. Albert

[57] ABSTRACT

A content-addressable memory wherein match transistors are prevented from discharging a match line by either placing transistors in series with the match transistors and only turning them on during a match sensing period, or a match sense line which is driven near the precharge voltage of the match line until the match sensing period. The match sensing line also provides charging current to recharge the match line. For some applications, a differential match line amplifier is used to detect matches and mismatches. The match sense line can be used with a CAM having a four-transistor comparator. The invention is also applicable to match lines in programmable-array logic (PAL) cells, and for either NMOS or PMOS circuits.

8 Claims, 8 Drawing Sheets

PULSED GROUND CIRCUIT FOR CAM AND PAL MEMORIES

BACKGROUND OF THE INVENTION

The present invention relates to the field of content addressable memories (CAMs). More specifically, in one embodiment the invention provides an improved means for sensing the contents of a CAM cell.

CAMs are commonly used in cache memories and translation look-aside buffers (TLBs). A TLB is used to translate virtual addresses into physical addresses, usually in the context of a virtual memory management unit. The translation is accomplished in a TLB by coupling the outputs of a CAM with a random-access memory (RAM) storing physical addresses. In a translation operation, a virtual address is input to the CAM, and one, if any, of CAM locations indicates that its contents, a virtual address, matches the input virtual address input to the CAM. A match indication signal indicating which CAM location matched is used to address an RAM location, where a CAM location and a corresponding RAM location define a virtual-physical address pair. The RAM then outputs the physical address in the addressed RAM location, thus completing the translation cycle.

A cache memory operates in a similar manner, except that the data stored in the CAM and the RAM are not necessarily address values. Although the following discussion refers to TLBs, similar extensions of the concepts discussed are applicable to caches as well.

A CAM gets its name from the fact that a value in the CAM is not located by its location, but by the contents of the CAM (although dual-mode addressing, by content and by location, is a feature of some CAMs). Thus, a CAM is addressed by applying a value to an input of the CAM, and the CAM responds by indicating which, if any, memory location contains the value input.

Because a TLB is used in address translation it is a critical path in a memory access, and therefore any delay or speed improvement in performing the translation will show up in the memory access time. The cause for delay in a TLB will become apparent from the following discussion of how a TLB circuit is laid out.

FIG. 1 is a block diagram of a computer system 10, including a CPU 12 which has an output coupled to an input of a TLB 14. TLB 14 in turn has an output coupled to an address input of a memory 16, which outputs data on a data bus 18 back to CPU 12.

In a memory access operation, CPU 12 outputs a virtual address which CPU 12 wishes to access. The virtual address is input to TLB 14, and a short time later, TLB 14 outputs a physical address to memory 16. While memory 16 is shown as a single block in FIG. 1, memory 16 may be a complex memory system including caches and other memory devices. For the present discussion, it is only important that memory 16 outputs data words based on physical addresses input to memory 16. As FIG. 1 shows, the delay between the output of a virtual address from CPU 12 and the input of data by CPU 12 from data bus 18 is dependent on the delay between the input of a virtual address to TLB 14 and the output of a physical address from TLB 14.

FIG. 2 is a block diagram showing TLB 14 in greater detail. In TLB 14, the virtual address input is coupled to a CAM 24. Cam 24 has L rows of CAM cells, with M cells per row, with one match line output for each row. The L match lines are inputs to an RAM data array 26, which has L rows, or words, or N bits each. RAM 26 has an N-bit output bus for outputting a physical address.

Thus, when an M-bit virtual address is input to CAM 24, it is matched against L virtual addresses, although all rows need not contain valid virtual addresses, and the match line output is asserted for the row containing a valid virtual address. The values for the integers L, M, and N need not be any particular value, but one example is a TLB with 64 rows, or entries, with 20-bit virtual addresses and 20-bit physical addresses (L=64, M=20, N=20). While M and N are equal in this example, it is not a necessary condition of a TLB.

Mechanisms for ensuring either that only one match is possible or that only one match is acknowledged, and that invalid entries are ignored are well known in the art of TLB construction. Mechanisms for handling exceptions where no match is found are also well known in the art. Therefore, the following discussion will assume without loss of generality, that one and only one match line output is asserted for an input virtual address.

FIG. 3 is a block diagram showing CAM 24 in greater detail. Within CAM 24, each input bit is coupled to a bit line controller 30, which has two outputs labelled BL and L_BL. CAM 24 is shown as a two-dimensional array of CAM cells 39, although for clarity, not all M×L cells are shown. Each CAM cell 39 is shown in a particular row and column, and is shown coupled to the bit lines BL and L_BL that are associated with the CAM cell's column and coupled to a match line 36 that is associated with the CAM cell's row. A match line 36 is coupled to a recharging means 38 and a match output of each CAM cell 39 in the row with which the match line 36 is associated. A CAM cell 39 is shown in FIG. 3 as an RAM cell 32 and a comparator cell 34. RAM cells 32 have a line coupled to each bit line, BL and L_BL, associated with its CAM cell 39, and two comparator lines coupled to comparator cell 32. Comparator cell 32 in turn has a line coupled to each of the same bit lines, and one line coupled to the match line 36 associated with CAM cell 39 row.

FIG. 4 is a block diagram showing an example of a CAM cell 39, which comprises RAM cell 32 and comparator cell 34, in greater detail, along with the match line 36 and bit lines, BL and L_BL, associated with CAM cell 39. Also shown in greater detail is an example of recharging means 38.

RAM cell 32 comprises two inverters 40, 42 and two transmission transistors 50, 52. Transistor 50, when turned on, couples a node L₁₃S to bit line L_BL, while transistor 52, when turned on, couples a node S to bit line BL. An output of inverter 40 and an input of inverter 42 are coupled to node S, while an input of inverter 40 and an output of inverter 42 are coupled to node L_S. The gates of transistors 50, 52 are coupled to a CAM write line 51, and nodes S and L_S are coupled to comparator inputs C and L_C, respectively.

Comparator inputs C and L_C are coupled to the inputs of transistors 46, 44, respectively. Transistor 44 is coupled at a drain terminal to bit line BL and at a source terminal to a drain terminal of transistor 46, while a source terminal of transistor 46 is coupled to bit line L_BL. While drain and source terminals are indicated on many transistors, these terminals may, at some point in their operation, change roles, since the transistors discussed herein are field-effect transistors. A match transistor 48 is coupled at a gate to the node between transistors 44, 46, at a drain to match line 36, and at a source to ground.

Unless otherwise indicated, the transistors discussed herein, such as transistors 50, 52, 44, 46, and 48, are NMOS FET (N-channel metal-oxide-semiconductor field-effect transistor) devices. In FIG. 4, recharging means 38 comprises a PMOS (P-channel metal-oxide-semiconductor) FET 53 which has a source terminal coupled to $V_{cc}$, a drain terminal coupled to match line 36, and a gate terminal coupled to ground ($V_{ss}$).

Although FIG. 4 only shows one CAM cell 39, bit lines BL and L_BL extend beyond the figure, indicating that they connect in a similar manner to the other L-1 CAM cells associated with the same bit with which CAM cell 39 is associated. In a similar manner, CAM write line 51 and match line 36 extend beyond the figure, indicating that they connect in a similar manner to the other M-1 CAM cells which are in the same CAM cell row as CAM cell 39.

Two functions of a CAM cell, writing a value into CAM cell 39 and comparing a value to the value written into CAM cell 39 will now be described with reference to FIGS. 3 and 4.

The value written into CAM cell 39 is either a 1 or a 0. Throughout this disclosure, logical 1 refers to and is interchangeable with a logical high, and a voltage $V_{cc}$, while logical 0 refers to and is interchangeable with a logical low, and a voltage $V_{ss}$. In a write operation, bit line BL is driven to a high or low voltage equal to the value to be written, while bit line L_BL is driven to its complement, and CAM write line 51 is driven high from its quiescent low voltage. When CAM write line 51 is driven high, transistors 50, 52 connect BL to node S and L_BL to node L_S. Because of the inverter loop formed by inverters 40, 42, the voltages on nodes S, L_S remain after CAM write line goes low. Thus, so long as CAM write line 512 remains low, the content of RAM cell 32 does not change.

For a compare operation, the input value to be compared against RAM cell 32 contents is applied to bit line BL, and its complement is applied to bit line $L_{13}$ BL. If the value on bit line BL matches the value on node S, the values on bit line $L_{13}$ BL and node L_S will also match, and lines C and L_C will match BL and L_BL respectively. For example, if node S is held high and BL is driven high, line C will be held high, and node L_S, node L_C, and bit line L_BL will all be low. In such a case, transistor 46 will be on and transistor 44 will be off, causing the node between the two transistors 44, 46 to be driven low (since it is coupled to L_BL, which is low), and because that node is coupled to the gate of match transistor 48, match transistor 48 is off. The reverse is also true. Of course, if the bit lines are held low, match transistor 48 is off regardless of the values on lines C, L_C.

Thus, match transistor 48 turns on when the bit lines are driven with complementary values and the value at node S mismatches the value on BL, but otherwise match transistor 48 remains off. Before a compare operation begins, recharging means 38 keeps match line 36 charged up to $V_{cc}$. If and when match transistor 48 turns on, a current path is created from match line 36 to ground, and this path discharges match line 36 towards ground (even though recharging means 38 continues to supply current to match line 36). FIG. 3 shows all comparator cells 34 in a row are connected to that row's match line. Therefore, if any one of the bits input to CAM 24 mismatches against the cells of a row, that row's match line will start to discharge. The number of mismatched cells determines the rate at which the match line will discharge, and if a complete match of each bit in a row occurs, the match line for that row will not discharge. Once the matching row, if any, is detected (i.e., all but one match line has a detectable discharge), the match detect operation is terminated and recharge means 38 begins to recharge match line 36. To allow match line 36 to recharge, the mismatch-indicating match transistors 48 are turned off by driving the bit lines BL and L_BL both low, can be done by bit line controller 30 in response to a disable signal, which in some embodiments is generated by a match detecting circuit (not shown).

FIG. 5 is a schematic diagram showing inverters 40 and 42 in greater detail. In FIG. 5, inverter 40 is formed by a PMOS device 54 and an NMOS device 56. The gates of PMOS device 54 and NMOS device 56 are tied together and form the input to inverter 40, while the source of PMOS device 54 is tied to $V_{cc}$, the drain of PMOS device 54 is tied to the drain of NMOS device 56 which together form the output of inverter 40, and the source of NMOS device 56 is tied to ground. Similarly, inverter 42 is formed by a PMOS device 58 and an NMOS device 60. The gates of PMOS device 58 and NMOS device 60 are tied together and form the input to inverter 42, while the source of PMOS device 58 is tied to $V_{cc}$, the drain of PMOS device 58 is tied to the drain of NMOS device 60 which together form the output of inverter 42, and the source of NMOS device 60 is tied to ground.

If CAM 24 is used for a series of translations in quick succession, as is usually the case, each access cycle must be long enough to accommodate the time required for the setup and stabilization of the bit lines, the time required to discharge the match lines enough to be detected, and the time required to recover from a mismatch and recharge the match line. When these times are added together, the result is an undesirable delay. With faster and faster computers requiring faster memory access times, delay is undesirable and lowers the performance of the computer. A typical sequential CAM access cycle has two periods, a match sensing period and a precharge period. The match sensing period begins with values being placed on the bit lines, and can end anytime after a match is detected. However, since the period times are generally fixed, the fixed match sensing period time must be the detect time for the slowest case, which is where only one bit is mismatched in a CAM cell row. The precharge period can begin after a match sensing period. The time for this period is dictated by how fast the bit lines can be driven low (to stop match transistors 48 from discharging match line 36), and recharging means 38 can recharge match line 36.

Several solutions have been proposed to the problems caused by long CAM access cycles. One solution is to increase the speed of the CAM by using faster technology, such as moving from $\lambda = 1$ micron technology to $\lambda = 0.35$ micron technology ($\lambda$ is a measure of semiconductor feature spacing). For example, one of the causes of delay in a semiconductor circuit is gate capacitance, which can be reduced by moving to lower feature spacing. However, advanced semiconductor technologies do not come without a cost, such as increased heat generation, lower yields and increasingly complex fabrication machinery. Also, with smaller feature sizes, some devices, such as current sources, are less effective if made smaller and begin to take up relatively more chip space as the feature size goes down. Even if smaller feature sizes are used, the need exists for even faster cache response times, since the circuits which need to access the CAM are proportionally faster when made with smaller feature sizes.

Because the time delays discussed above are serial, each adds to the overall delay. Thus, the need exists to reduce the bit line setup time, the match detection delay, and the match line recharge time.

One solution to reduce the match detection delay is illustrated by FIG. 6. FIG. 6 shows one of the match lines 36 input into a match sense amplifying inverter 80. Inverter 80 comprises a PMOS transistor 82 coupled at its source to V$_{cc}$, coupled at its drain to an output line 84 of inverter 80, and at its gate coupled to match sense line 36. Inverter 80 also comprises an NMOS transistor 86 coupled at its drain to output line 84, with a grounded source, and a gate also coupled to match sense line 36. The width of transistor 82 is indicated as nW, which is n times the width of transistor 86. FIG. 6 also shows a graph of how the voltage on match line 36 affects output line 84, showing the discharge of the match line for one, two, and three mismatched CAM cells.

When match line 36 goes high, transistor 82 turns off and transistor 86 turns on, and the output is coupled to ground, while when match line 36 goes low, transistor 82 turns on and transistor 86 turns off, and the output is coupled to V$_{cc}$, thus forming an inverter. As match line 36 discharges, it eventually discharges far enough that output line 84 goes high, indicating a mismatch.

If inverter 80 is symmetrical (n=1), output line 84 would not go low until the match line discharges past V$_{cc}$/2. However, if n is greater than one, the threshold voltage at which output line 84 changes is $$V_T \approx (1 - g/(n+g))*V_{cc},$$

where g is the transconductance (gm) ratio of NMOS to PMOS. The equality is not exact, mainly due to the difference between V$_{tn}$ and V$_{tp}$, however such effects are not germane to the present discussion.

As indicated in FIG. 6, the time, t, required to detect a match is lower for a higher value of n. Shortening the match detect time by raising the value of n is not without cost however. If n is increased, transistor 82 will occupy more chip space, which is always at a premium in semiconductor designs. Furthermore, as the threshold voltage, V$_T$, gets closer to V$_{cc}$, the more effect noise and variations in V$_{cc}$ will have on the triggering of inverter 80. The rate at which match line 36 discharges is proportional to the number of mismatch-indicating match transistors 48 which turn on. While inverter 80 may sense the discharging of match line 36 sooner with more than one mismatch, a CAM must be designed with a match detect time sufficient to detect the slowest case, that of a single bit mismatch.

FIG. 7 illustrates one alternative to increasing the size of PMOS transistors in inverter 8. FIG. 7 shows an inverting match sense amp 88 which has match line 36 as a negative input, a voltage threshold line as a positive input, and output line 84 as its output. However, such a circuit suffers similar problems. While an internal PMOS transistor may be small, chip space is needed for a circuit to generate a voltage threshold, V$_{TH}$ and the problem of noise is still present.

One solution proposed to reduce the match line recharge time is to increase the size of PMOS transistor 53 in recharging means 38. However, this also requires additional chip space, and enlarging transistor 53 increases the overall capacitance seen by match line 36, thus leading to longer discharge times for a given voltage drop on match line 36. Since the discharge rate of match line 36 is variable with the number of mismatches, and transistor 53 must be designed for the worst case, it must be large enough to replace the charge discharged in the worst case where all the match transistors 48 in a row indicate mismatches, thus chip space is likely to be underutilized by transistor 53. Transistor 53 must also be large enough to keep match line 36 charged even if the bit lines drift up a bit from ground, as this drift will cause some match transistors 48 to turn on slightly.

From the above it is seen that an improved means for keeping a match line from being discharged during the precharging period, an improved means for recharging the match line in a short time, and a means for quickly detecting a match or mismatch is needed.

SUMMARY OF THE INVENTION

An improved CAM cell and TLB is provided by virtue of the present invention.

In one embodiment of a CAM according to the present invention, match transistors are coupled at their gates to comparators for a row of CAM cells and are coupled to a match line and a circuit for stopping the flow of current through the match transistors during the precharge period.

In some embodiments, the means for stopping the flow of current through the match transistors is a row of match sense transistors in series between the match transistors and ground. The gates of the match sense transistors are coupled to a match sense signal, which turns the match sense transistors off for the precharge period and turns them on in the match sensing period.

In other embodiments, the means for stopping the flow of current is a match sense line coupled to the drains of each of the match transistors. The match sense line is driven by a match sense signal, where the match sense signal is low for the match sensing period and high for the precharging period. In the precharging period, the match sense line is driven high, which raises the drain voltage of the match transistors to a voltage near the precharged level for the match line. The match transistor provides a path for current to flow from the match sense line to the match line to recharge the match sense line.

In one embodiment, to further speed the recovery time, a match sensing means, such as a match sense amplifier having an input coupled to the match line, causes the match sense line to go high, and start the precharging period, as soon as a mismatch is detected. This limits the amount of charge which is allowed to discharge from the match line. For some applications, a differential match line is used for the match sense amplifier.

One advantage of the present invention is the reduction of current which leaks from the match line through match transistors when the match line during the precharge period, since the match transistors are prevented from discharging the match line during that period, regardless of the voltages on the bit lines. Further advantage is provided by the match transistors as they provide current to recharge the match line.

An advantage of using the match transistors for recharging the match line is that, if the bit lines are left unchanged for a time, the number of match transistors supplying current to the match line will be the same as the number which discharged the match line, thus providing a match line recharge rate proportional to the discharge rate.

Another advantage of the present invention is that a recharging means need not be designed to replace current lost during the precharge period due to errant voltages on the bit lines, and in some embodiments can be eliminated altogether.

The present invention is applicable to comparator cells using three transistors, as well as those using four transistors, which have two match transistors per comparator cell. The present invention is also not limited to writable CAM cells, as it can also be applied to programmable-array logic (PAL) cells.

Although most of the examples described herein are NMOS or PMOS circuits, the present invention is applicable to many other technologies.

A further understanding of the nature and advantages of the inventions herein may be realized by reference to the remaining portions of the specification and the attached drawings.

DESCRIPTION OF THE PREFERRED EMBODIMENTS

Figure 8:
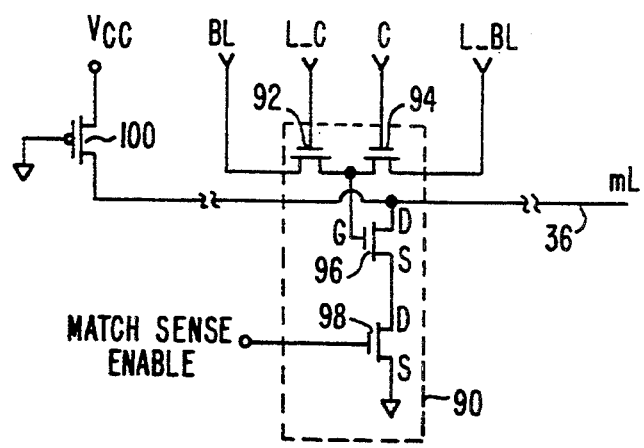
FIG. 8 is a schematic diagram of an embodiment of a comparator cell using a match sense transistor according to the present invention.

FIG. 8 shows a comparator cell 90, which is used in a CAM cell (see FIGS. 3, 4) in place of comparator cell 34. Cell 90 has several inputs, is coupled to match line 36, and comprises four NMOS transistors, comparator transistors 92 and 94, match transistor 96, and match sense transistor 98. When a comparator cell such as cell 90 is used in each CAM cell of a row (see FIG. 3), their components also form rows, i.e., a row of match transistors 96 and a row of match sense tranistors 98. FIG. 8 shows two each of match tansistors 96 and match sense transistors 98 to illustrate this point.

Figure 1:
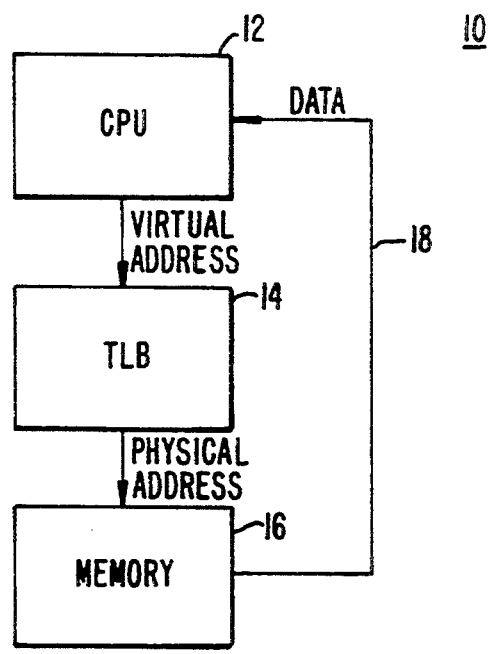
FIG. 1 is a block diagram of a computer system using a translation look-aside buffer (TLB)
Figure 2:
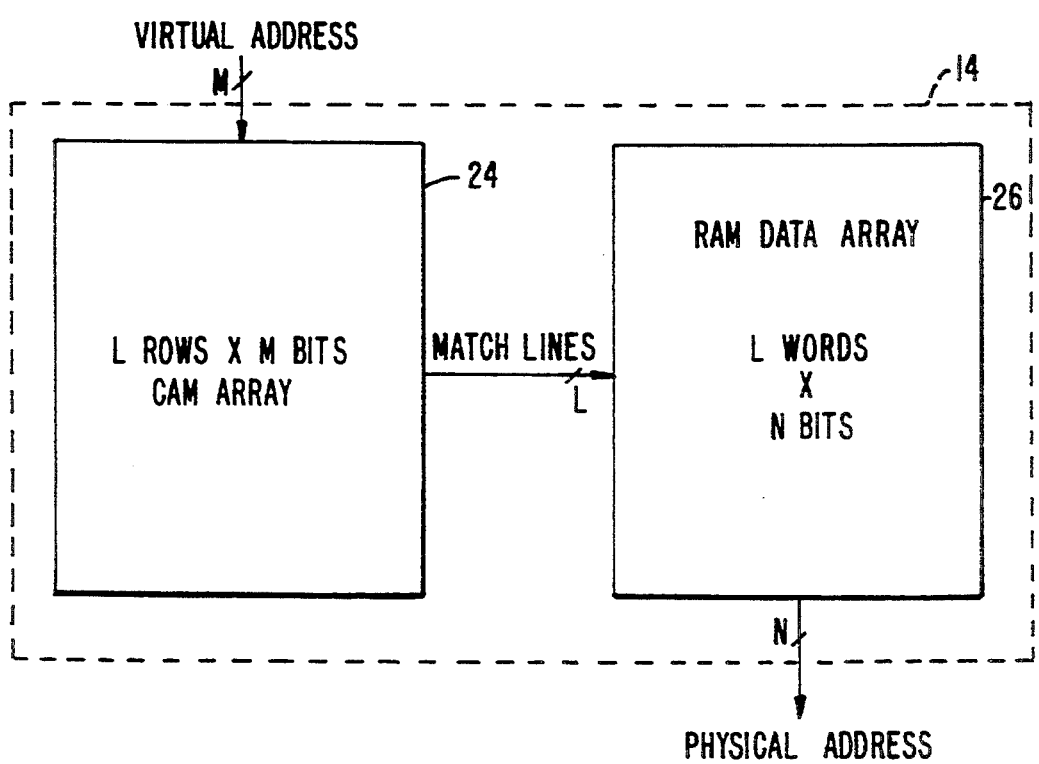
FIG. 2 is a block diagram of a TLB which uses a content-addressable memory (CAM) array.
Figure 3:
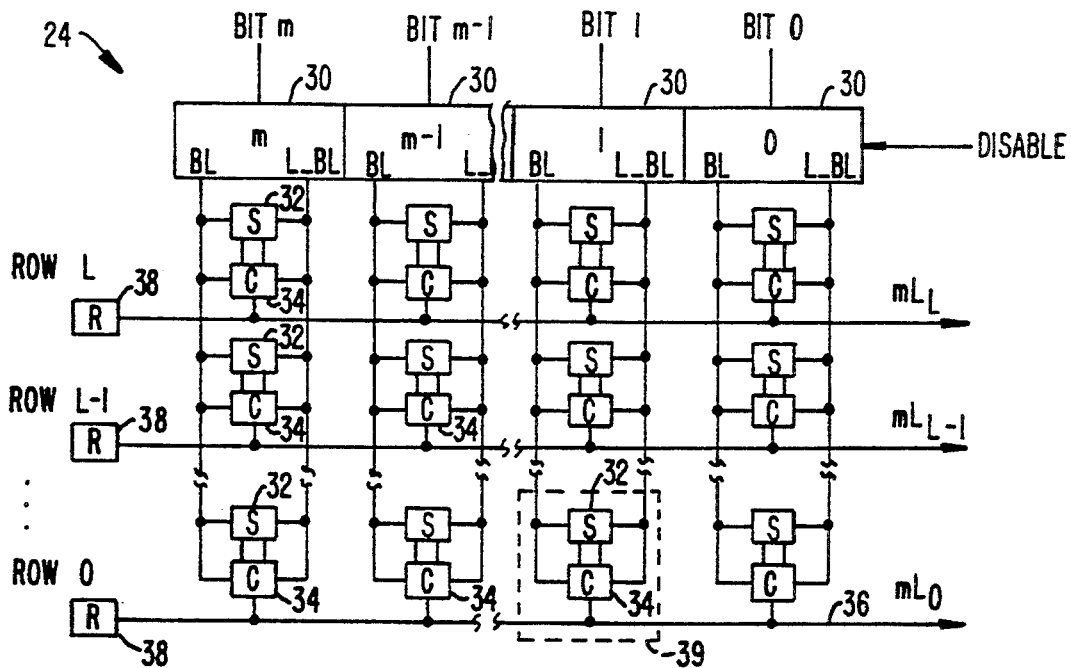
FIG. 3 is a block diagram showing the CAM of FIG. 2 in greater detail.
Figure 4:
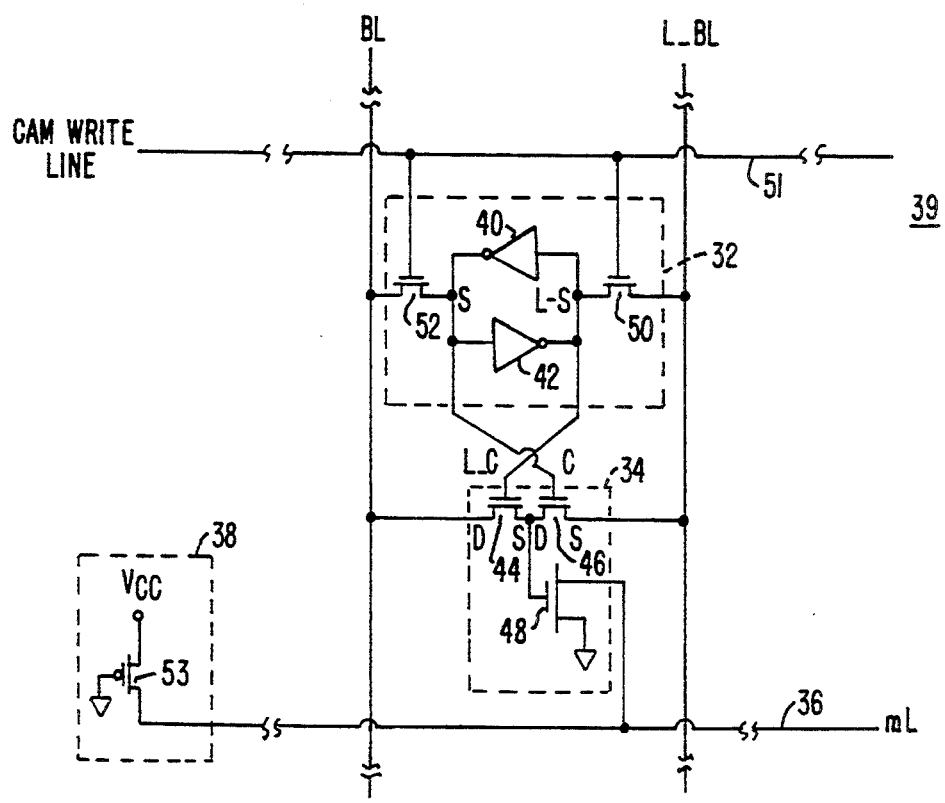
FIG. 4 is a schematic diagram of one cell of the CAM shown in of FIG. 3.
Figure 5:
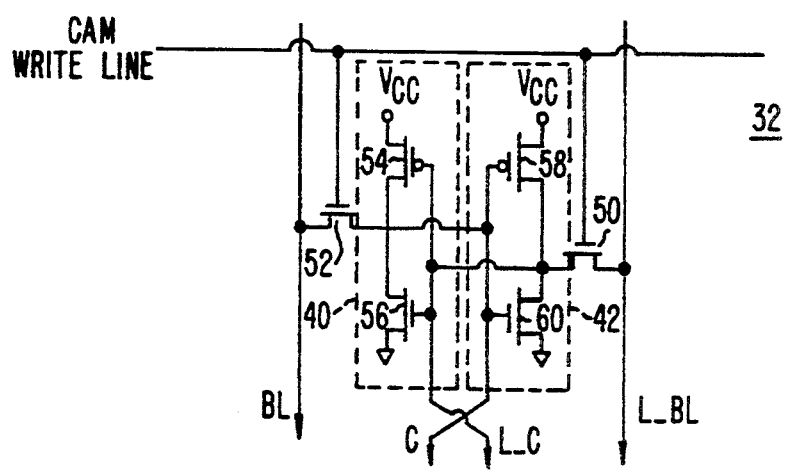
FIG. 5 is a schematic diagram showing the RAM cell of FIG. 4 in greater detail.

Transistor 92 couples a node G to input bit line BL when transistor 92 is turned on, and transistor 94 couples node G to input bit line $L_{13}$ BL when transistor 94 is turned on. The gate of transistor 92 is coupled to the L_C comparator line, and the gate of transistor 94 is coupled to the C comparator line. The lines BL, L_BL, C and L_C are provided as shown in FIGS. 3 and 4. A PMOS transistor 100 is provided between match line 36 and $V_{cc}$, with its gate tied to ground.

The gate of match transistor 96 is also coupled to node G. The drain of match transistor 96 is coupled to match line 36, and the source of match transistor 96 is coupled to the drain of match sense transistor 98. The source of match sense transistor 98 is tied to ground, and its gate is an input for a match sense enable signal (MSENSE). Although particular terminals are identified as source or drain terminals, such designations are for clarity only where field-effect transistors are used, as they are symmetrical devices.

As discussed above, in a compare operation, complementary values of an input bit are applied to bit lines B and L_BL, where the input bit is the bit to be matched against a bit stored in an RAM cell. Complementary signals indicating the contents of the RAM are available on the C and L_C lines. As FIG. 4 indicates, a match exists when bit line BL is driven to the same logical value as C, and L_BL and L_C are complements of that same logical value. Thus, during a compare, if the input bit matches the stored bit, node G is driven low, and if the input bit is the complement of the stored bit, node G is driven high.

If node G is driven high, match transistor 96 turns on, but this does not necessarily lead to the discharge of match line 36, as was the case of the circuit shown in FIG. 4. Match line 36 can only be discharged through match transistor 96 if a match sense transistor 98 is turned on. Thus, if in an TLB/CAM access cycle, MSENSE is driven high during a match sensing period and low during a precharge period, the state of the bit lines during the precharge period are not important. Thus, cell 90 allows for shortened TLB/CAM access cycles, since bit lines BL and $L_{13}$ BL can be set up and stabilized while match line 36 is recharging, whereas previous circuits required a period between the completion of the recharge and the match operation for bit line setup.

When a match sensing period begins, a CAM cell (see FIG. 4) contains a bit value which is present in line C, and its complement is present on line L_C. Bit lines BL and L_BL are also set up with the input value to be compared and its complement before the start of the match sensing period. If there is a mismatch, node G will rise. Significantly, the voltage on node G indicating a match or a mismatch can be in place when match sense transistor 98 is turned on by MSENSE going high. Thus, even the match sensing period can be shortened by the use of a match sense transistor, since all the mismatch-indicating match transistors can be set to begin discharging match lines at the same time. In some embodiments, the gates of the match sense transistors for each of L×M CAM cells are connected to a single MSENSE line.

Figure 9:
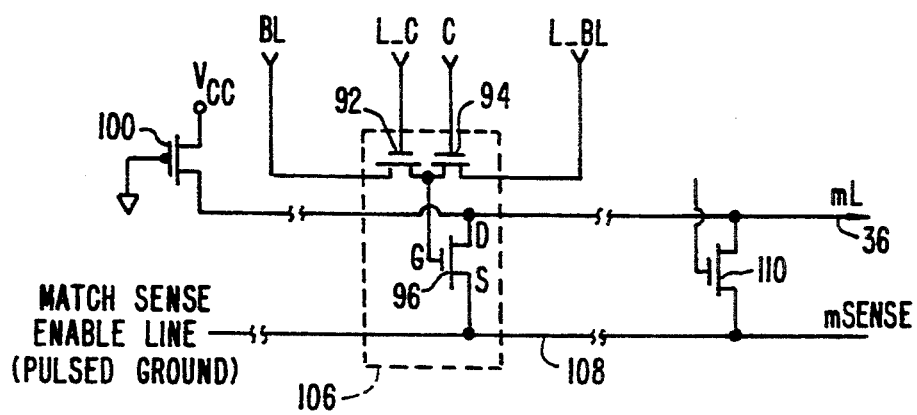
FIG. 9 is a schematic diagram of an embodiment of a comparator cell using a match sense enable line according to the present invention.

FIG. 9 shows a comparator cell 106, which is similar to comparator cell 90, except that match sense transistor 98 is not used. Instead, the sources of match transistor 96 of each CAM cell in a row are coupled to a match sense enable line 108 which carries the match sense enable signal MSENSE. Match sense enable line 108 is also referred to as a "pulsed-ground" line, since it effectively connects the match transistor sources to ground, and the connection is only pulsed to ground during a match sense period. Also shown in FIG. 9 is another match transistor 110 from a CAM cell, which for the purposes of the following discussion, is a match transistor for a CAM cell in which the input bit matches the stored bit and which is in the same CAM cell row as match transistor 96.

The use of a match sense line provides even further benefits over the use of match sense transistors. For one, one transistor per CAM cell is eliminated. Another benefit is that the match transistors and the match sense line are used to recharge the match line, as the following example of an access cycle will make clear.

As described above, suppose the voltage on node G indicating a match or a mismatch is in place when the match sense period begins, that node G is high, indicating the presence of a mismatch in the associated CAM cell, and that the gate on match transistor 110 is low, indicating a match in the CAM cell associated with match transistor 110. Although the gate of match transistor 96, and possibly the gates of other mismatch-indicating match transistors 96, are high, match line 36 is not discharged until match sense enable line 108 is driven low.

When match sense enable line 108 is driven low, current flows from match line 36 to match sense enable line 108 through match transistor 96, but not through match transistor 110, and the voltage on match line 36 begins to fall. Once sufficient time has passed for the discharge of match lines 36 to be detected if they are going to be discharged, the precharge period begins. The precharge period begins with match sense enable line 108 going high again.

At the beginning of the precharge period, the bit lines are kept at the levels they had during the match sensing period, thus keeping the same match transistors 96 on as were on during the match sensing period. At this point, if match line 36 has discharged at all, the voltage on match line 36 is lower than $V_{cc}$, therefore current flows from match sense enable line 108, which is at $V_{cc}$, through mismatch-indicating match transistors 96 to match line 36.

Because match transistors 96 are used to recharge match line 36, PMOS device 100 can be designed much smaller. Also, since the same number of match transistors 96 charge match line 36 as discharged it, the time needed for recharge is independent of the number of mismatches. Thus, a CAM can be designed to wait a much shorter time before beginning another access cycle. In some embodiments, PMOS device 100 is eliminated altogether. The reduced size or elimination of device 100 improves the performance of the CAM, since the reduction of the gate to source capacitance of the PMOS device reduces the total capacitance on match line 36, which increases the speed at which it can be discharged.

Normally, match transistor 96 cannot be expected to stay on when match sense enable line 108 is driven all the way up to $V_{cc}$, since the gate voltage on a match transistor is limited to $V_{cc}-V_{tn}$ by the fact that the gates of transistors 92 and 94 can only be driven to $V_{cc}$. However, the present invention takes great advantage of the gate-to-source capacitance ($C_{gs}$) of match transistor 96 to boost the gate voltage of match transistor 96 (node G) above $V_{cc}$. This bootstrapping occurs because the voltage drop from node G to match sense enable line 108 is $V_{cc}-V_{tn}$, and $C_{gs}$ of match transistor 96 will tend to hold that voltage difference as the voltage on match sense enable line 108 rapidly changes from ground to $V_{cc}$. If no other capacitances are in parallel with $C_{gs}$, the voltage at node G will rise to $2 V_{cc}-V_{tn}$, allowing match sense enable line 108 to recharge match line 36 up to $V_{cc}$ until the voltage at node G drops below $V_{cc}-V_{tn}$.

As in the circuit of FIG. 8, the match sense enable line in FIG. 9 could be tied to a single means for generating the MSENSE signal for all the rows of a CAM.

Figure 10:
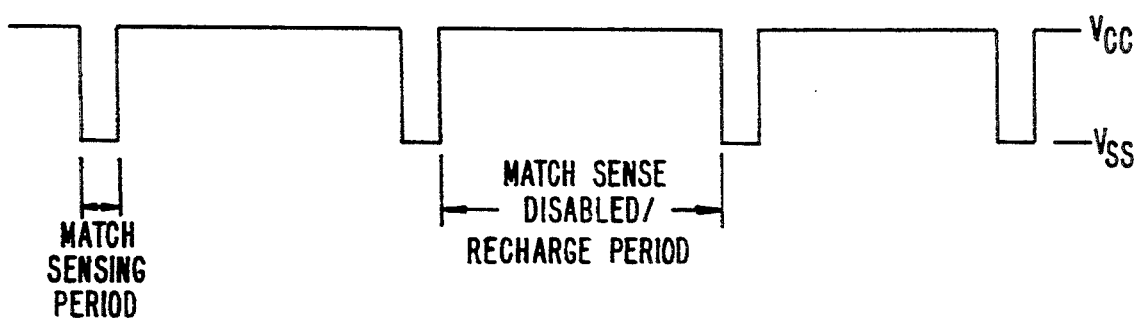
FIG. 10 is a graph showing a waveform of a match sense enable signal.

FIG. 10 is a waveform diagram of the match sense signal applied to the gate of match sense transistor 98 in FIG. 8, or to match sense enable line 108 in FIG. 9. The relative lengths of the two periods, the match sensing period and the precharge period are not necessarily of the proportions shown. Typically, the lengths of the periods are determined by the timing required by the application in which CAM 24 is used, as well as the chip real estate available for match line sensing amplifiers and recharging devices and the sensitivity of the match sense amplifiers. The more sensitive the match sense amplifiers are, the sooner mismatches can be detected on the match line, and thus the less the match lines are discharged. The less the match lines are discharged, the less time it takes to recharge the match lines before the end of the precharge period.

During the precharge period, when the match lines 36 are allowed to recharge back up to $V_{cc}$ if they were discharged, MSENSE is low, thereby disabling the flow of current in the match transistors, which prevents them from discharging match lines 36 regardless of the voltages on the match transistor gates. Thus, match lines 36 are not affected by the voltages on bit lines BL and $L_{13}$ BL. Because match lines 36 are not affected by the bit lines during the precharge period, this period can be used to set up the bit lines. If the bit lines can be set up and ready when match lines 36 have completed recharging, the memory cycle can be shortened over the prior art, which required the bit lines to be held low during the precharge period.

The above description is illustrative and not restrictive. Many variations of the invention will become apparent to those of skill in the art upon review of this disclosure. For example, the present invention is applicable to alternative embodiments such as a four-transistor comparator cell, or circuits implemented with PMOS gates. The present invention is also not limited to CAM cells, but is also applicable to programmable-array logic (PAL) cells.

Figure 11:
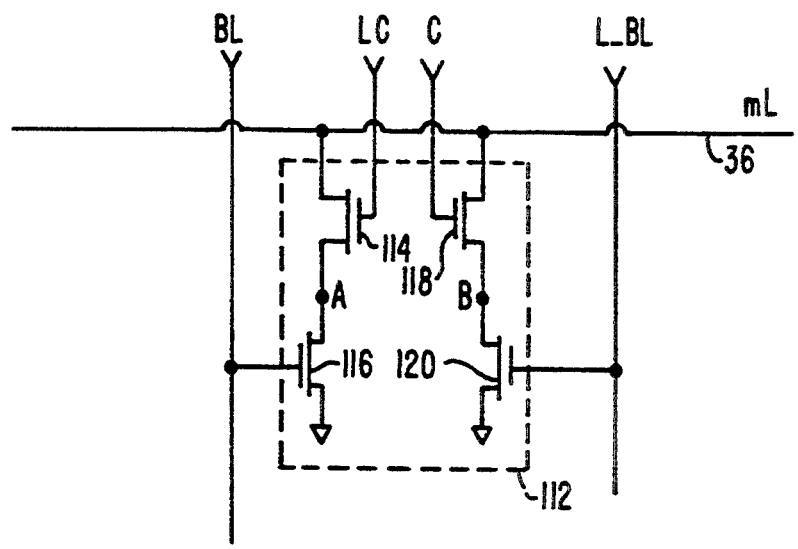
FIG. 11 is a schematic diagram of a four-transistor comparator cell.

For example, FIG. 11 shows an embodiment of a comparator cell 62 comprising four transistors instead of the three transistors used in comparator cell 34 (see FIG. 4). The four transistors of comparator cell 112 are connected as follows. A transistor 114, when its gate is high, couples match line 36 and a node A; the gate of transistor 114 is coupled to the comparator line L_C. A transistor 116, when its gate is high, couples node A to ground; the gate of transistor 116 is coupled to the input bit line BL. A transistor 118, when its gate is high, couples match line 36 and a node B; the gate of transistor 118 is coupled to the comparator line C. A transistor 120, when its gate is high, couples node B to ground; the gate of transistor 120 is coupled to the input bit line $L_{13}$ BL.

As with the three-transistor comparator cell, comparator cell 112 couples match line 36 to ground when an input bit mismatches an RAM contents. The mismatch is indicated to comparator cell 112 by BL being complementarily driven with respect to C, while a match is indicated by BL and C being similarly driven. In a match operation, $L_{13}$ BL complements BL and L_C complements C. Thus, in a mismatch, either BL and L_C are high with L_BL and C low, or BL and L_C are low with L_BL and C high. If both BL and L_C are high, match line 36 discharges to ground through transistors 114 and 116. If instead, $L_{13}$ BL and C are high, match line 36 is discharges to ground through transistors 118 and 120. On the other hand if BL and C match, $L_{13}$ BL and L_C will match and complement BL and C. In such a case, one and only one transistor coupled to each of nodes A and B will be on and the other will be off, providing no path for current to flow from match line 36 to ground.

As in the three-transistor comparator cell 34 shown in FIG. 4, comparator cell 112 will discharge match line 36 during a precharge period if bit lines BL and L_BL are not both held low. Of course, only one of BL and $L_{13}$ BL need to be held low during a precharge period to prevent discharge, but knowledge of which to hold low requires knowledge of the state of the RAM cell driving the C and L_C lines. However, if the states of the RAM cells in a CAM are known outside the CAM, there would be little sense in having a CAM in the first place.

Figure 12:
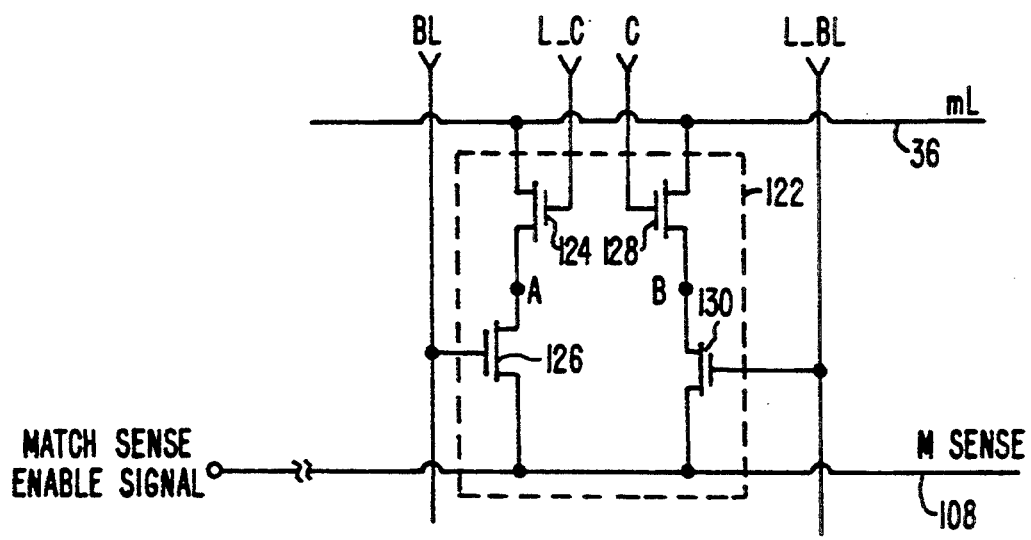
FIG. 12 is a schematic diagram of an embodiment of a four-transistor comparator cell using a match sense enable line according to the present invention.

FIG. 12 shows one embodiment of a four-transistor comparator cell 122 according to the present invention. The four transistors of comparator cell 122 are connected as follows. A transistor 124, when its gate is high, couples match line 36 and a node A; the gate of transistor 124 is coupled to the comparator line L_C. A transistor 126, when its gate is high, couples node A to match sense enable line 108; the gate of transistor 126 is coupled to the input bit line BL. A transistor 128, when its gate is high, couples match line 36 and a node B; the gate of transistor 128 is coupled to the comparator line C. A transistor 130, when its gate is high, couples node B match sense enable line 128; the gate of transistor 130 is coupled to the input bit line $L_{13}$ BL.

This circuit is similar to that of FIG. 11, except that transistors 126 and 130 are not connected directly to ground, but are connected to the "pulsed ground" provided by match sense enable line 108. In this circuit, match sense enable line 108, when low allows for the discharge of match line 36 when a mismatch is present, but when high, prevents the discharge of match line 36 regardless of the states of the input bit lines and comparator lines from an RAM cell.

Figure 13:
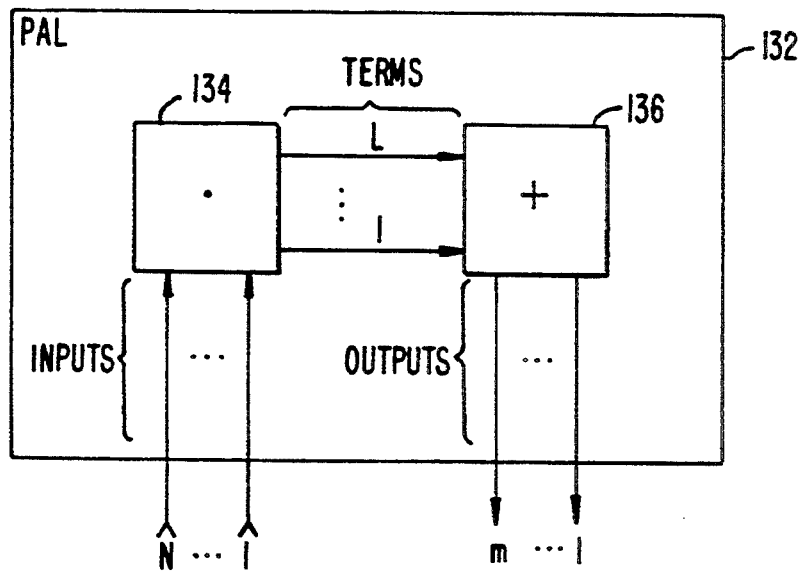
FIG. 13 is a block diagram of a programmable-array logic (PAL) circuit.

FIG. 13 shows a programmable array logic device (PAL) 132, which comprises an AND plane 134, an OR plane 136, N inputs to AND plane 134, L term lines from AND plane 134 to OR plane 136, and M outputs from OR plane 136. AND plane 134 is an N×L array of programmable connections, and OR plane 136 is an L×M array of programmable connections. One such connection within AND plane 136 is shown in greater detail in FIG. 14.

An output of PAL 132 is a function of one or more "terms" "OR"ed together. The terms, a number L of which are supported in PAL 132, are in turn a function of one or more of the N inputs "AND"ed together. In this way, arbitrarily complicated functions of the inputs can be created, limited only by the number of terms provided in PAL 132. Typically, each of the programmable connections is programmable as shown in FIG. 14 to form the functions of the inputs.

Figure 14:
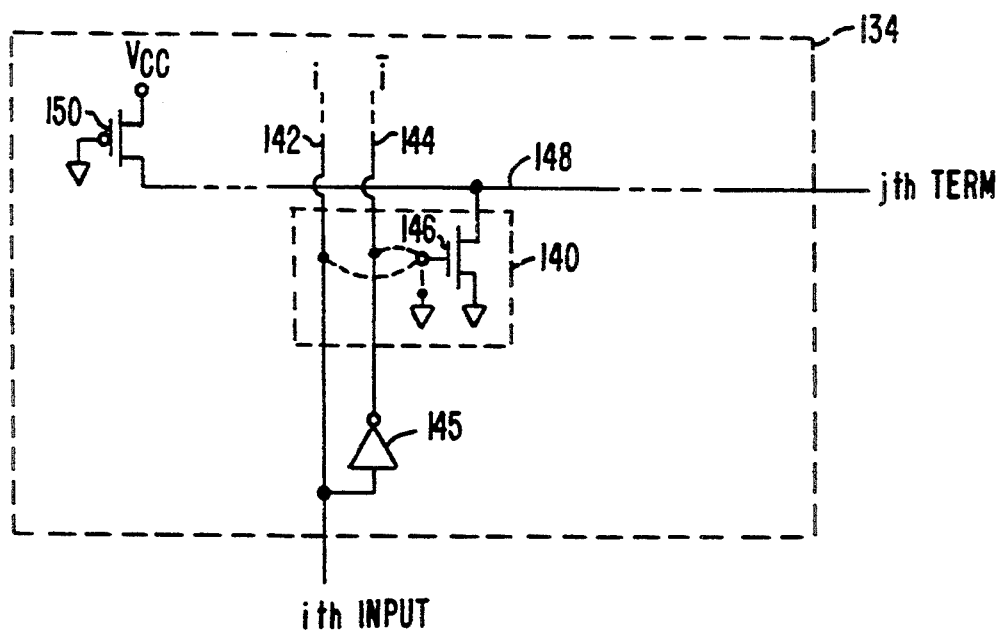
FIG. 14 is a schematic diagram of a known cell used in a PAL.

FIG. 14 is a schematic diagram of one of the L×N programmable connections, or cells, of AND plane 134, which shows how an "i"th input (of N inputs) becomes an input affecting a "j"th term (of L terms). For each of N inputs, two lines are provided, an input line and its complement. In the cell shown, a cell 140, an input line 142 for the ith input and its complement line 144 are provided. Signals on complement line 144 might be provided by an inverter 145 which inverts the signals on line 142.

If the jth term is to be a function of the ith input, it is an ANDing of either line 142 or line 144 and other input lines. Each possibility is indicated by a dotted line to the gate of a match transistor 146. If the jth term is not a function of the ith input, the gate of match transistor 146 is tied to ground. If it is a function of the ith complementary input, match transistor 146 is tied to line 142, and if it is a function of the ith input, match transistor 146 is tied to complementary line 144. The methods of tying PAL transistor gates to one of the three possible nodes is well known in the art.

In a PAL operation, suppose the function desired for the jth term is indeed an AND of the ith input and other inputs. In the desired operation, if the ith input is low, the jth term output should be low regardless of the other inputs being ANDed with the ith input. To effect this operation, the gate of match transistor 146 is coupled to line 144. This way, when the ith input is low, line 144 is high, and match transistor 146 discharges a match line 148 towards ground. Depending on the timing requirements of the design, the jth term output might be buffered through differential match lines or a comparator. A pull-up transistor 150 recharges match line 148 when the inputs change. A similar arrangement of transistor logic is provided in OR plane 136.

Figure 15:
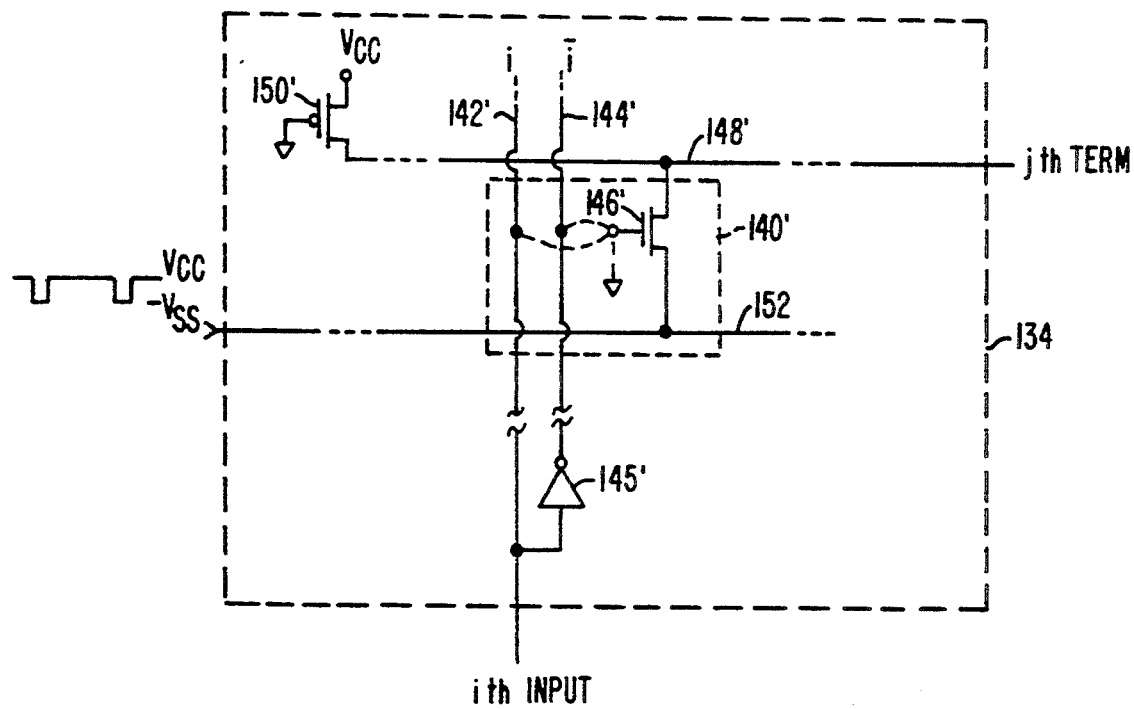
FIG. 15 is a schematic diagram of one embodiment of a PAL cell in the PAL circuit of FIG. 13 according to the present invention.

FIG. 15 is a schematic diagram of an embodiment of a PAL cell 140' in an AND plane 134' according to the present invention. PAL cell 140' is similar to PAL cell 140 shown in FIG. 14, in that the circuit of FIG. 15 includes input line 142', complement line 144', inverter 145', match transistor 146', match line 148', and pull-up transistor 150'. However, PAL cell 140' differs from PAL cell 140 in that match transistor 146' does not couple match line 148' to ground when turned on, but instead couples match line 148' to a match sense line 152. Match sense line is lowered to $V_{ss}$ for a test, but then is returned to $V_{cc}$.

Figure 16:
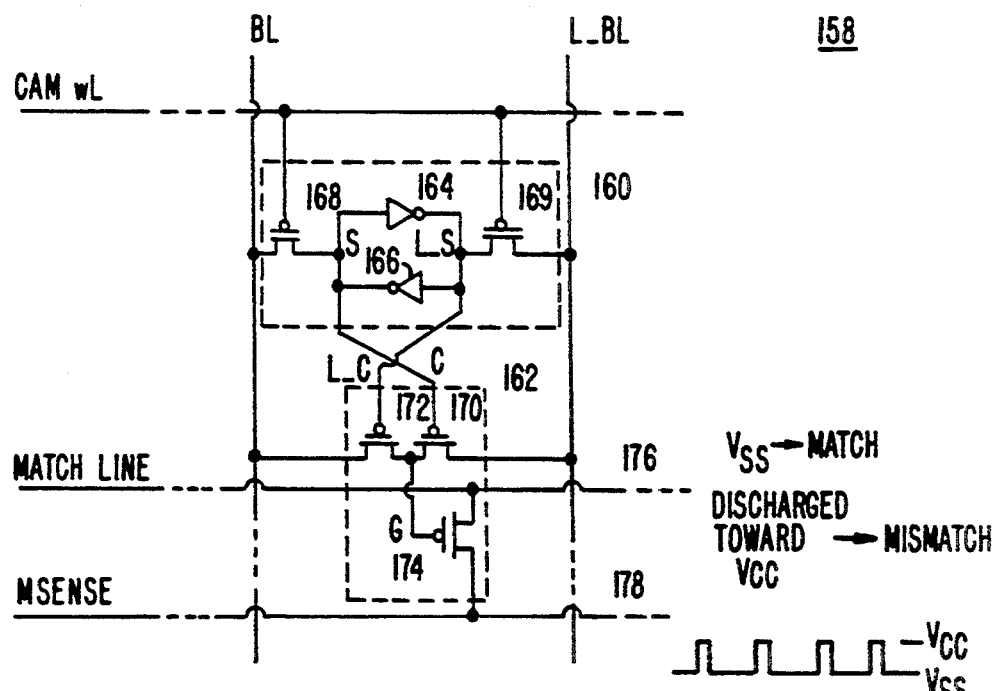
FIG. 16 is a schematic diagram of an embodiment of a comparator cell using a match sense enable line and PMOS transistors according to the present invention.

FIG. 16 illustrates an embodiment of a CAM cell 158 according to the present invention implemented with PMOS transistors. NMOS transistors are preferred, due to the favorable characteristics of NMOS versus PMOS which are well known in the art, however CAM cell 158 is presented to illustrate that the present invention is also applicable to PMOS devices.

CAM cell 158 comprises an RAM cell 160 formed by two inverters 164 and 166. Inverter 164 is inverts the value at a node S onto a node L_S, while inverter 166 inverts the value at node L_S onto node S, which will stably hold a one bit value on node S and its complement on node L_S. A transmission gate 168 couples an input bit line BL to node S when gate 168 is on, and a transmission gate 169 couples an input bit line L_BL to node L_S when gate 169 is on. Gates 168 and 169 are turned on by a CAM write line, which goes low to turn on the gates. When gates 168 and 169 are turned on, complementary nodes S and L_S take on the values present on lines BL and L_BL, respectively.

The value on node S is provided to comparator cell 162 on a comparator line C, and the value on node L_S is provided to comparator cell 162 on a comparator line L_C. The input bit lines BL and L_BL are also provided to comparator cell 162. Two comparator transistors 170 and 172, and a match transistor 174 are provided in comparator cell 162. The gate of transistor 170 is tied to line C and the gate of transistor 172 is tied to line L_C. If transistor 170 is on (line C is low), bit line L_BL is coupled to a node G, whereas if transistor 172 is on (line L_C is low), bit line BL is coupled to node G. Node G is input to the gate of match transistor 174, and when turned on, match transistor 174 couples a match line 176 to a match sense enable line 178.

Since C and L_C are not low at the same time, only one of transistor 170 and 172 are on at any one time. If the bit lines BL and L_BL are driven with complementary values, and BL matches C, L_BL and L_C will also match, and the CAM cell is said to match. In the match condition, node G is high, and in the mismatch condition, node G is low. Thus, a mismatch can be detected on match line 176, which is charged to $V_{ss}$, and will discharge to $V_{cc}$ if a mismatch occurs. The discharging of match line 176 occurs because mismatch-indicating match transistors 174 will couple match line 176 to match sense enable line 178, which is driven to $V_{cc}$ during the match sense period. Of course, during the precharge period, match sense enable line 178 is driven low, preventing the discharge of match line 176 regardless of whether match transistor 174 is on or not.

Figure 6:
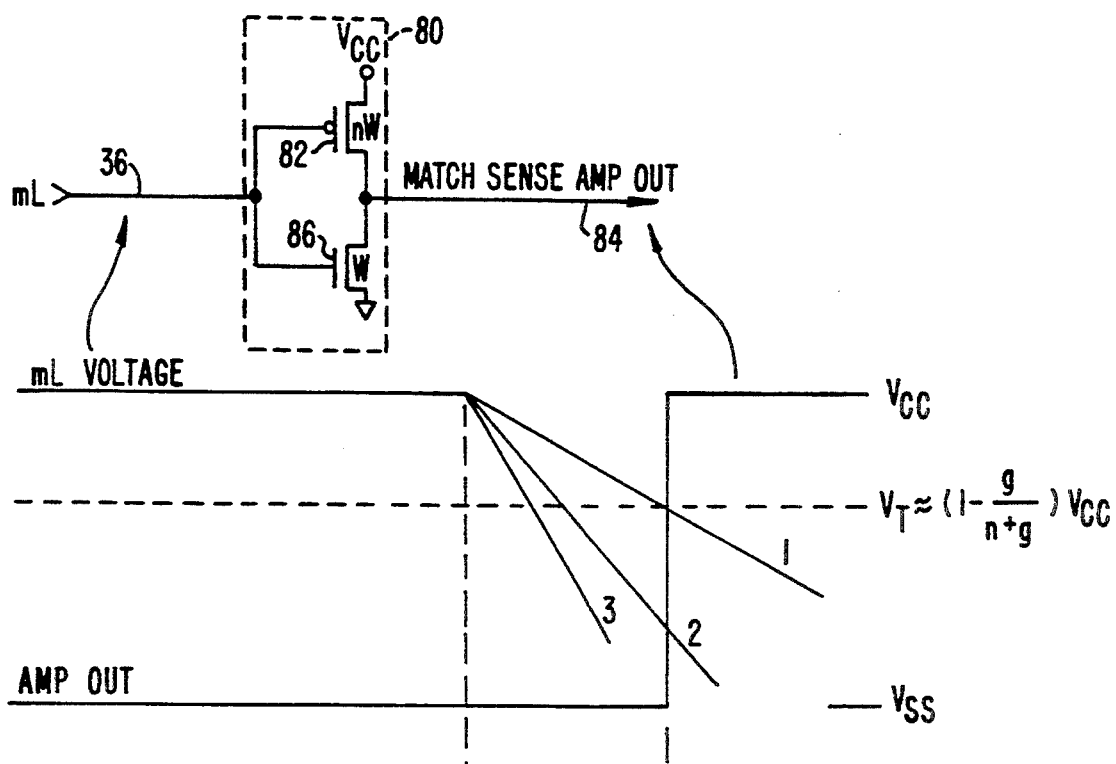
FIG. 6 is a schematic diagram of a match sense amplifying inverter.
Figure 7:
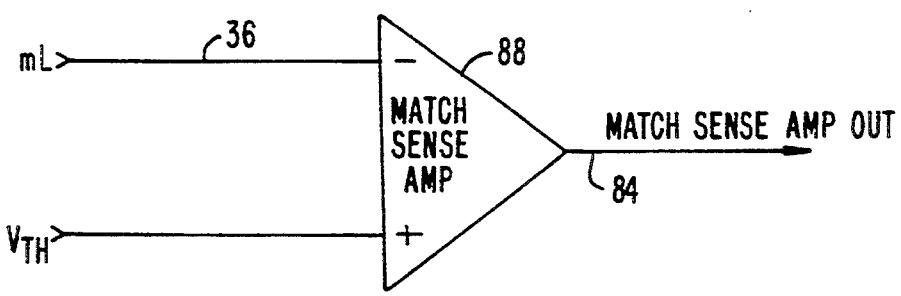
FIG. 7 is a block diagram of an alternate embodiment of a match sense amplifying inverter.

As discussed above, one factor which determines the length of a TLB/CAM access cycle is the time required to detect a mismatch. A mismatch is detected when a match sense amplifier, or other sensing device, reacts to the drop in voltage on a match sense line caused by one or more match transistors discharging the match sense line towards either ground or a low voltage on a match sense enable line. The discharge to ground could be directly to ground, or via a match sense transistor. In the discussion accompanying FIGS. 6 and 7, alternatives for quickly detecting the drop in voltage on a match sense line due to mismatches are discussed.

Figure 17:
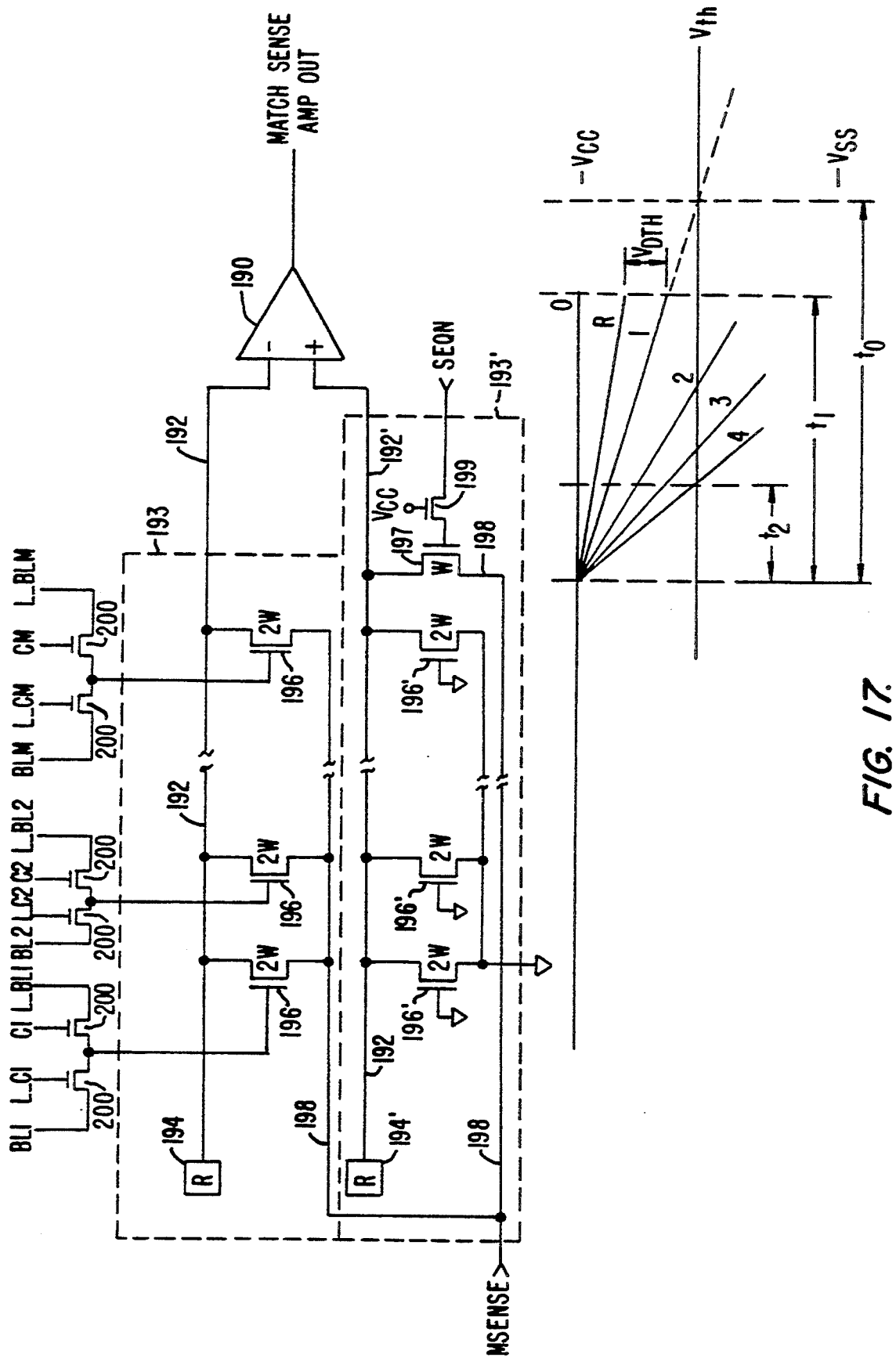
FIG. 17 is a schematic diagram of a differential match sense amplifier according to the present invention.

FIG. 17 shows another means for quickly detecting the drop in voltage on a match sense line, a differential match sense amplifier 190. Differential match sense amplifier 190 has two inputs, a negative input coupled to a match line 192, and a positive input coupled to a reference line 192'. A match circuit 193 is coupled to match line 192 and a reference circuit 193' is coupled to reference line 192'.

Match circuit 193 includes recharging means 194, if used, and a plurality of match transistors 196, one per CAM cell in a CAM cell row. Reference circuit 193' includes recharging means 194', if used, and a plurality of reference transistors 196', with a one-to-one correspondence between transistors 196 and 196'. Reference circuit 193' also includes a transistor 197 and a transmission gate 199, which could also be a transistor.

Recharging means 194 is coupled to match line 192, and recharging means 194' is coupled to reference line 192'. Each match transistor 196 is coupled at a source terminal to a match sense enable line (MSENSE) 198, at a drain to match line 192, and at a gate terminal to nodes of comparator cells in each of the CAM cells in the row. Each reference transistor 196' is coupled at a source terminal to ground, at a drain to reference line 192', and at a gate terminal to ground. In some embodiments, each reference transistor 196' is coupled to the MSENSE line. Transistor 197 is coupled between reference line 192' and MSENSE 198, with its gate coupled to one terminal of transmission gate 199. The gate of transmission gate 199 is tied to $V_{cc}$, and the other end of transmission gate 199 is an input for a sequence signal SEQN.

Although, for perfect matching, coupling reference transistors 196' to MSENSE better reflects the connection of the match transistors 196 to MSENSE, coupling transistors 196' to ground reduces the capacitance on the MSENSE line, and the source-to-drain capacitance of transistors 196' is usually small enough so as not to adversely affect the timing of the circuit.

Each of the transistors 196, and 196' are labelled 2 W to indicate their relative width, which is equal. The relative width of transistor 197 is also indicated, W, which is half the width of transistors 196, 196'. In some designs, the layout of transistors 196, 196', and 197 is simplified by laying out many equal transistors of width W, using one for transistor 197 and using two in parallel to make transistors 196, 196'.

In a precharge period, MSENSE is high, and SEQN is low, and therefore, match line 192 and reference line 192 are recharged up to $V_{cc}$. When a match sensing period begins, MSENSE is driven low and SEQN is driven high. As discussed above, a mismatch in a given cell is indicated by a gate of a corresponding match transistor 196 going high, whereas a match is indicated by the gate staying low. If any one match transistor's gate goes high, that transistor will turn on and, during a match sensing period, will conduct current from match line 192 to match sense enable line 198. Thus, match of all the CAM cells in a given row is indicated by the match line 192 for that given row staying high during a match sensing period, whereas a mismatch in the given row is indicated by the match line going low.

The rate at which the voltage on match line 192 drops for a mismatch is proportional to the number of mismatches and is related to the total capacitance between ground and match line 192. Because of the symmetry between circuit 193 and circuit 193', the capacitance between reference line 192' and ground is similar to that of match line 192.

FIG. 17 contains a graph showing the voltage drops on line 192 (lines 0, 1, 2, 3, 4) and line 192' (line R). The lines labelled with numbers indicate the voltage on line 192 when that number of mismatches a present. Thus, as expected, the voltage on line 192 does not drop if there are no mismatched cells, and the voltage drops twice as fast for two mismatches as for one mismatch, etc. The reference voltage on line 192' drops half as fast as line 192 would for one mismatch, because of transistor 197.

If only one mismatch occurs, only one match transistor 196 will conduct, and on the reference circuit side, the only transistors to conduct will be transistor 197.

Since transistor 197 is half the size of a match transistor 196, it will only conduct half the current for the same gate voltage, all other factors being equal. Transmission gate 199 ensures that the gate voltages of transistor 197 and transistors 196 are equal when SEQN is at $V_{cc}$, since the gate of transmission gate 199 is held at $V_{cc}$. This is because the voltage at the gate of transistor 197 is $V_{cc}-V_{tn}$, and the gate voltage of the match transistors 196 which are on is also $V_{cc}-V_{tn}$, due to the gate-source drop of the comparator transistors 200.

A differential match sense amp is preferred where common-mode noise is a problem. With differential amp 190, in the worst case of only one mismatch, amp 190 need only detect a differential threshold voltage of $V_{DTH}$ between reference line 192' and match line 192. This time for detection is indicated as $t_1$, and the time for detection of two mismatches is indicated as $t_2$. As FIG. 17 illustrates, with the appropriate sensitivity, $V_{DTH}$ can be chosen small enough so that $t_1$ is a shorter time than the common-mode mismatch detection time, $t_c$.

While the above description discloses several alternative embodiments of the present invention it is illustrative and not restrictive. Many other variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A content addressable memory (CAM), wherein a match line associated with a row of CAM cells indicates a match condition when a value placed on a plurality of bit lines matches a value stored in the row of CAM cells, comprising:
   a row of match transistors, each match transistor of said row of match transistors coupled at a gate to a match output of a corresponding CAM cell of the row of CAM cells, and said each match transistor coupled at a first terminal to the match line;
   a match sense line coupled to a second terminal of each match transistor of said row of match transistors, said match sense line carrying a match sense signal, said match sense signal characterized by two different voltages, a sensing voltage and a charging voltage, wherein a voltage level of the match line is sensed when said match sense line is at said sensing voltage to detect a match condition if present; and
   means for supplying charge to the match line through said match transistors to charge the match line to a quiescent level when said match sense line is at said charging voltage.

2. A CAM according to claim 1, further comprising:
   a plurality of rows of CAM cells, each of said plurality of rows of CAM cells containing values which are matched against the value placed on the plurality of bit lines; and
   a plurality of match lines, each of said plurality of match lines indicating a match condition, if present, for a corresponding row of said plurality of CAM cells.

3. A CAM according to claim 1, wherein said row of match transistors are NMOS devices.

4. A CAM according to claim 1, further comprising means for driving said match signal sense line to said charging voltage in response to detecting one of either a match or a mismatch on the match line.

5. A match sense circuit, wherein a plurality of match lines, each indicating either a match or mismatch in a cell, are input to the match sense circuit, and wherein an output of the match sense circuit indicates a match when all the inputs indicate a match in their corresponding cell and indicates a mismatch when at least one of the inputs indicates a mismatch, the match sense circuit comprising:
   N match transistors, where N is an integer equal to the number of inputs, with a gate of each match transistor coupled to a corresponding input, wherein current is allowed to flow between a first terminal and second terminal of a match transistor when said input coupled to said gate of said match transistor indicates a mismatch in a corresponding cell;
   a match line coupled to said first terminals of each of said N match transistors;
   means coupled to said match line for charging said match line to a charged voltage;
   a match line current sink coupled to said second terminals of each of said N match transistors, wherein, during a match sense period, a signal voltage on said match line drops from said charged voltage at a rate substantially proportional to the number of said N match transistors which allow current to flow between their first and second terminals;
   a reference line;
   means coupled to said reference line for charging said reference line to said charged voltage;
   a reference line current sink;
   a reference discharge transistor, coupled between said reference line and said reference line current sink, for discharging, during a match sense period, said reference line to said reference line current sink at a rate less than a discharge of said match line with a single match transistor indicating a mismatch; and
   a comparator coupled at a signal input to said match line and coupled at a reference input to said reference line, for comparing said signal voltage on said match line with a reference voltage on said reference line, wherein said comparator indicates a mismatch when said signal voltage differs from said reference voltage by more than a predetermined difference threshold voltage.

6. The match sense circuit of claim 5, further comprising N reference transistors coupled between said reference line and said reference line current sink to mirror, onto said reference line, capacitive and leakage current effects which are caused by said N match transistors on said match line when inputs to each of said N match transistor hates indicate matches.

7. The match line sense circuit of claim 5, wherein said match line current sink and said reference line current sink are blocked from sinking current at times other than said match sensing period.

8. The match sense circuit of claim 7, wherein said match and reference line current sinks are blocked, at said times other than said match sensing period, from sinking current by raising a voltage level of said match and reference line current sinks.

* * * * *